United States Patent
Tanefusa et al.

(10) Patent No.: US 7,917,872 B2
(45) Date of Patent: Mar. 29, 2011

(54) SIMULATION METHOD AND COMPUTER-READABLE STORAGE MEDIUM

(75) Inventors: Yusuke Tanefusa, Kawasaki (JP); Norihiro Harada, Kawasaki (JP); Tsuyoshi Sakata, Kawasaki (JP); Tomoyuki Yamada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 419 days.

(21) Appl. No.: 12/111,470

(22) Filed: Apr. 29, 2008

(65) Prior Publication Data

US 2009/0037855 A1 Feb. 5, 2009

(30) Foreign Application Priority Data

Jul. 30, 2007 (JP) .................................. 2007-198003

(51) Int. Cl.
*G06F 17/50* (2006.01)

(52) U.S. Cl. ......... 716/103; 716/106; 716/110; 716/111

(58) Field of Classification Search .......... 716/103–111, 716/119–210
See application file for complete search history.

(56) References Cited

U.S. PATENT DOCUMENTS

| | | |
|---|---|---|
| 2003/0182649 A1* | 9/2003 | Harn .............................. 716/11 |
| 2004/0044511 A1 | 3/2004 | Sekido et al. |
| 2005/0268258 A1* | 12/2005 | Decker ............................ 716/4 |
| 2006/0150132 A1* | 7/2006 | Gupta ............................. 716/5 |
| 2008/0295057 A1* | 11/2008 | Tsien et al. ..................... 716/17 |

* cited by examiner

*Primary Examiner* — Paul Dinh
(74) *Attorney, Agent, or Firm* — Fujitsu Patent Center

(57) ABSTRACT

A simulation method to be implemented in a computer causes the computer to execute a procedure carrying out a weighting with respect to layout parameters of a circuit, which is an analyzing target, based on priority information of cells forming the circuit, and converting the weighted layout parameters into physical characteristics and storing the physical characteristics in a memory part, a procedure converting the physical characteristic read from the memory part into circuit parameters and storing the circuit parameters into the memory part, and analyzing the circuit based on a net list including the circuit parameters read from the memory part.

11 Claims, 8 Drawing Sheets

SIMULATION METHOD AND COMPUTER-READABLE STORAGE MEDIUM

BACKGROUND OF THE INVENTION

1. Field of the Invention

The present invention generally relate to simulation methods and computer-readable storage media, and more particularly to a simulation method for analyzing a semiconductor integrated circuit and to a computer-readable storage medium which stores a program for causing a computer to carry out procedures of such a simulation method.

2. Description of the Related Art

Conventionally, when carrying out a timing analysis or simulation of a circuit in at a layout design stage, for example, a net list is used. This net list includes information related to the types of cells or elements forming the circuit, dimensions of each part of the element and the like. However, the size of semiconductor integrated circuits, such as Large Scale Integrated (LSI) circuits, has become extremely small, and recently, it has become impossible to sufficiently describe the characteristics of the circuit using only the information included in the net list. For example, even the cells or circuits having the same shape may have different circuit characteristics depending on the layout patterns and the layout positions. The main reasons for the different circuit characteristics depending on the layout patterns and the layout positions include deviations in the circuit characteristics dependent on a pitch of polysilicon gates of transistors and deviations in the circuit characteristics dependent on stress caused by Shallow Trench Isolation (STI). Such deviations in the circuit characteristics have become more notable as the size of the LSI circuits has become smaller, and the effects of the deviation in the circuit characteristics on the timing analysis is becoming more and more complex.

A following method is known for carrying out a simulation of a circuit. The method carries out a simulation of a circuit based on the net list and parameters that are obtained from actually measured data of device characteristics.

The conventional timing analysis of the circuit is based on the net list which does not take into consideration the layout patterns and the layout positions of the circuit. For this reason, it is impossible to take into consideration the deviation in the circuit characteristic that occurs as the size of the LSI circuits is further reduced, and it is difficult to further improve the accuracy of the timing analysis.

SUMMARY OF THE INVENTION

According to one aspect of the present invention, there is provided a simulation method to be implemented in a computer, causing the computer to execute procedures comprising a first converting procedure carrying out a weighting with respect to layout parameters of a circuit, which is an analyzing target, based on priority information of cells forming the circuit, and converting the weighted layout parameters into physical characteristics and storing the physical characteristics in a memory part; a second converting procedure converting the physical characteristic read from the memory part into circuit parameters and storing the circuit parameters into the memory part; and an analyzing procedure analyzing the circuit based on a net list including the circuit parameters read from the memory part. According to this simulation method, it is possible to improve the accuracy of the circuit analysis.

DESCRIPTION OF THE PREFERRED EMBODIMENTS

Figure 1:
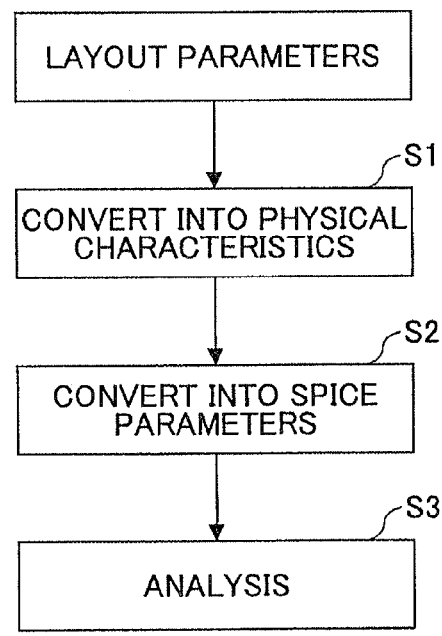
FIG. 1 is a flow chart for generally explaining procedures of a simulation according to the present invention.

FIG. 1 is a flow chart for generally explaining procedures of a simulation according to the present invention. As shown in FIG. 1, a step S1 converts layout parameters related to layout patterns and layout positions of a circuit, which is an analyzing target, into physical characteristics. A step S2 converts the physical characteristics into circuit parameters of a simulator which carries out a circuit simulation, such as Simulation Program with Integrated Circuit Emphasis (SPICE) parameters, by taking into consideration the layout parameters of the circuit. The layout parameters may be generated by a known method from GDS, for example, before numerical values of the layout information are obtained. In addition, the conversion of the physical characteristics to the SPICE parameters may also be carried out by a known method. A step S3 carries out an analysis, such as a timing analysis, at a layout design stage based on a net list including the SPICE parameters. The timing analysis itself based on the net list may be carried out by a known method. In one embodiment of the present invention, a weighting is carried out with respect to the layout parameters of the cells based on priority information, such as the type (or kind) and number of the cells forming the circuit, when converting the layout parameters into the physical characteristics in the step S1. Hence, it is possible to reflect, in the physical characteristics, circuit characteristics that differ depending on the layout patterns and the layout positions.

Figure 2:
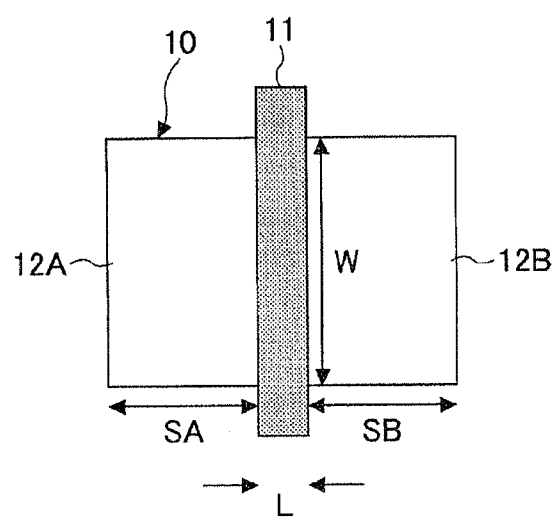
FIG. 2 is a diagram showing an example of a cell.

The cells are units with which the circuit is formed. FIG. 2 is a diagram showing an example of the cell. In the example shown in FIG. 2, a cell 10 is a transistor having diffusion regions 12A and 12B that are partitioned by a wiring 11. The diffusion regions 12A and 12B respectively have lengths (widths of source/drain regions) SA and SB along a horizontal direction in FIG. 2. In addition, the wiring 11 has lengths L and W respectively along the horizontal direction and a vertical direction in FIG. 2. The layout parameters of the circuit include the above parameters SA, SB, L and W, an area AS of the source region, an area AD of the drain region, a peripheral length PS of the source region, a peripheral length PD of the drain region and the like.

The physical characteristics of the circuit include Vth=Fvth(L, W, SA, SB, . . . ), Ids=Fids(L, W, SA, SB, . . . ) and the like, where Vth denotes a threshold voltage of the transistor, Ids denotes a source-drain current of the transistor, Fvth denotes a function describing the threshold voltage Vth, and Fids denotes a function describing the source-drain current Ids.

Figure 3:
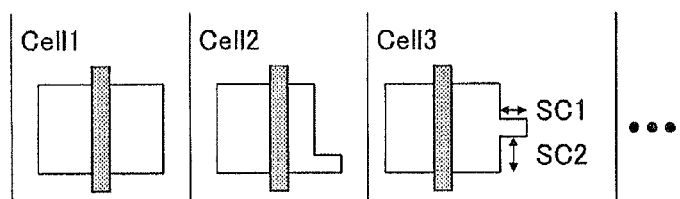
FIG. 3 is a diagram for explaining a table that is usable to convert layout parameters into physical characteristics.

FIG. 3 is a diagram for explaining a table that is usable to convert the layout parameters into the physical characteristics in the step S1. FIG. 3 shows an example where the table includes the layout parameters SA, SB, L and W of 3 types of cells Cell1, Cell2 and Cell3 having diffusion regions with mutually different shapes, and the physical characteristics that are measured by actually creating the cells Cell1, Cell2 and Cell3, that is, the actually measured values of the threshold voltage Vth and the source-drain current Ids. The weighted layout parameters are converted into the physical characteristics by weighting the layout parameters SA, SB, L and W within the table based on the priority information, and substituting the actually measured values within the table to the threshold voltage Vth and the source-drain current Ids. In FIG. 3, the layout parameters and the physical characteristics are respectively indicated in arbitrary units. Further, in FIG. 3 and FIG. 8 which will be described later, the shapes of the cells Cell1, Cell2 and Cell3 are merely shown for the sake of convenience so that it is possible to easily understand the corresponding relationship between the layout parameters and the physical characteristics, and the shapes of the cells Cell1, Cell2 and Cell3 are not included in the actual table. By preparing the table described above, it becomes possible to easily convert the layout parameters of each of the cells Cell1, Cell2 and Cell3 into the physical characteristics after weighting the layout parameters of each of the cells Cell1, Cell2 and Cell3. In a case where the diffusion region does not have a rectangular shape as in the case of the cell Cell3, for example, the layout parameters of course include information related to lengths SC1 and SC2 shown in FIG. 3 and the like.

When the physical characteristics Vth=Fvth(L, W, SA, SB, . . . ) and Ids=Fids(L, W, SA, SB, . . . ) described above are converted into the SPICE parameters in the step S2, parameters, such as delvto and mulu0, for changing the characteristics of the cell are obtained, where delvto denotes a parameter for changing the threshold voltage Vth of the transistor, and mulu0 denotes a parameter for changing a mobility of electrons passing through a channel of the transistor. When the SPICE parameters delvto and mulu0 are reflected to the net list, m01 pch L W AD AS PD PS SA SB delvto mulu0 are obtained, where m01 denotes a name (or code) that is assigned to the cell 10 shown in FIG. 2, for example, and pch indicates that the cell 10 is a p-channel transistor.

Because the circuit characteristics which differ depending on the layout patterns and the layout positions are reflected to the SPICE parameters, the circuit characteristic which differ depending on the layout patterns and the layout positions are also reflected to the net list which includes such SPICE parameters.

Figure 4:
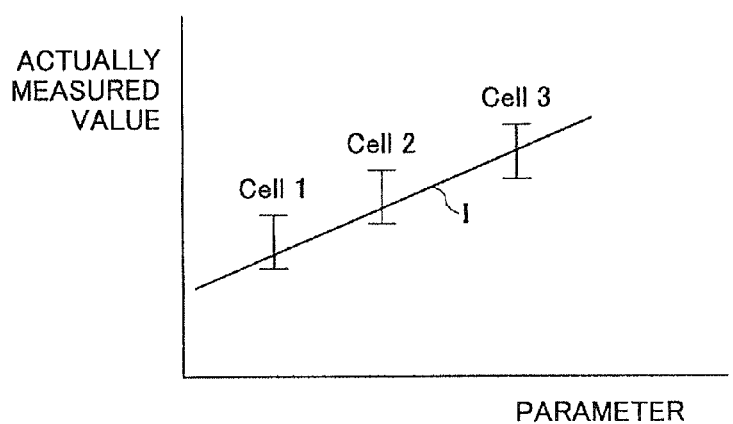
FIG. 4 is a diagram showing a relationship of values of layout parameters of cells and corresponding actually measured values.

FIG. 4 is a diagram showing a relationship of values of the layout parameters of the circuit formed by the cells Cell1, Cell2 and Cell3 and corresponding actually measured values. In FIG. 4, the ordinate indicates the actually measured values in arbitrary units, and the abscissa indicates the parameter values in arbitrary units. When the layout parameters are converted into the physical characteristics in the step S1, the weighting is carried out with respect to the layout parameters of the cells Cell1, Cell2 and Cell3 based on the priority information, such as the types, the number and the like of the cells Cell1, Cell2 and Cell3 forming the circuit, so that an approximately linear relationship I shown in FIG. 4 is maintained between the layout parameter values and the actually measured values for the circuit as a whole.

Therefore, when converting the layout parameters into the physical characteristics in this embodiment, a fitting technique using the weighting is employed in order to analyze the circuit based on the net list which includes the SPICE parameters that take into consideration the layout parameters of the circuit. For this reason, it is possible to improve the accuracy of the circuit analysis, because the difference between the results of the circuit analysis (or simulation results) and the actually measured values that are obtained by actually creating the circuit and measuring the various characteristics of the circuit is suppressed, and it is possible to carry out the analysis by taking into consideration the deviation of the circuit characteristics that occurs as the size of the LSI circuit is further reduced.

First Embodiment

Figure 5:
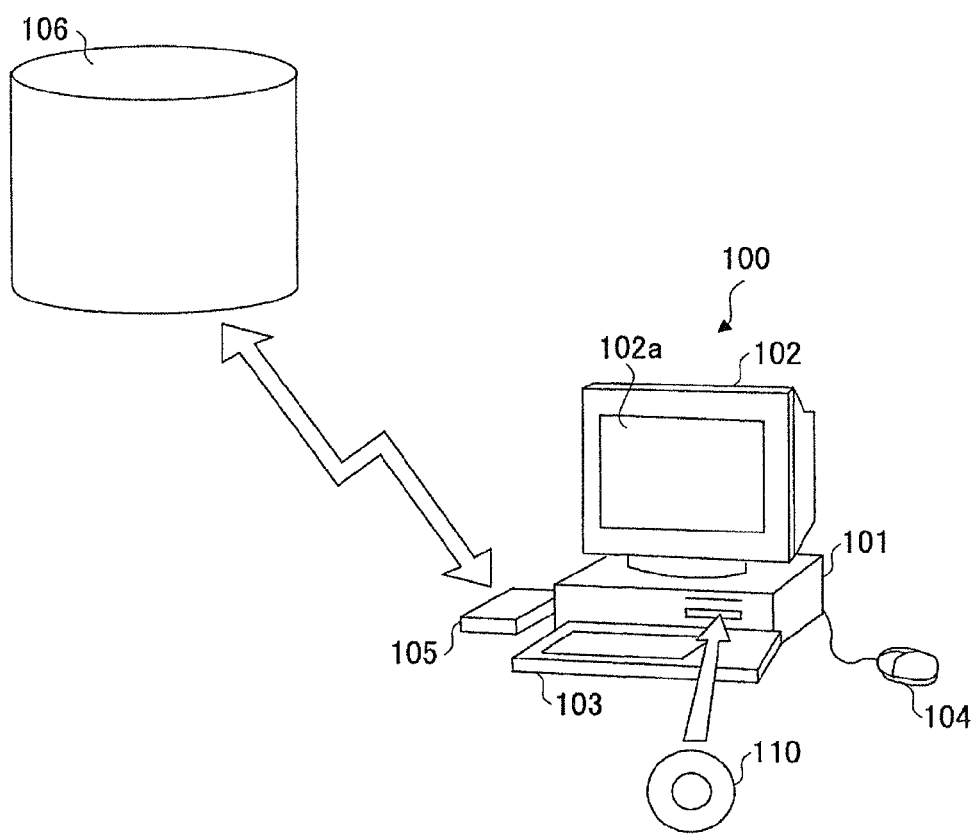
FIG. 5 is a perspective view showing a computer system to which the present invention may be applied.

FIG. 5 is a perspective view showing a computer system to which the present invention may be applied. A computer system 100 shown in FIG. 5 includes a main body 101, a display 102, a keyboard 103, a mouse 104, and a modem 105. The main body 101 includes a CPU, a disk drive and the like. The display 102 displays the results of the circuit analysis and the like on a display screen 102a in response to an instruction from the main body 101. The keyboard 103 is used to input various information to the computer system 100. The mouse 104 is used to specify an arbitrary position on the display screen 102a of the display 102. The modem 105 is used to make access to an external database and the like, and to down load programs and the like stored in other computer systems.

A program (or simulation software or tool), which causes the computer system 100 to at least have a simulation function including circuit analysis, is input to and compiled in the computer system 100. This program is stored in a portable recording medium such as a disk 110 or, is downloaded from a recording medium 106 of another computer system using a communication apparatus such as the modem 105. This program causes the computer system 100 (that is, a processor 201 which will be described later) to operate as a circuit design support apparatus (or simulation system) having the simulation function. This program may be stored in a computer-readable storage medium such as the disk 110. The computer-readable storage medium is not limited to portable recording media such as the disk 110, an Integrated Circuit (IC) card memory, a magnetic disk such as a floppy disk (registered trademark), a magneto-optical disk, a CD-ROM and the like, and includes various recording media capable of accessing a computer system that is connected to the computer system 100 via a communication means or communication apparatus such as the modem 105 and a Local Area Network (LAN).

Figure 6:
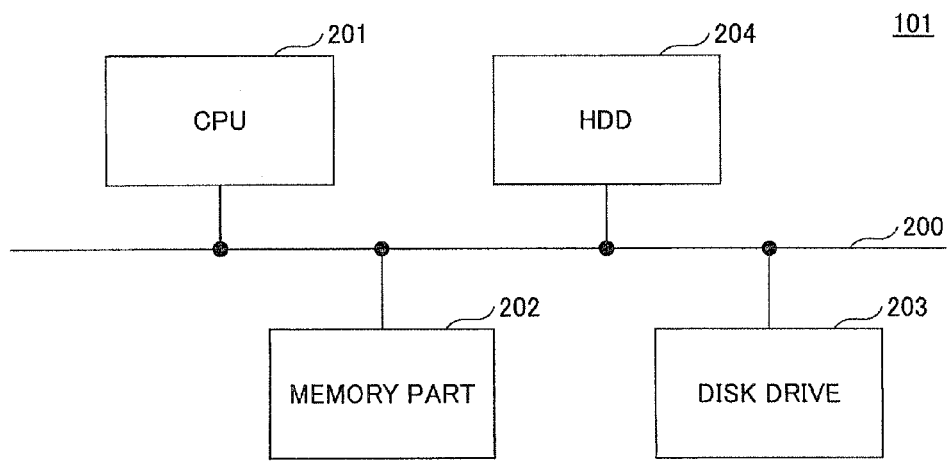
FIG. 6 is a system block diagram showing a structure of an important part within a main body of the computer system.

FIG. 6 is a system block diagram showing a structure of an important part within the main body 101 of the computer system 100. In FIG. 6, the main body 101 includes a processor (CPU: Central Processing Unit) 201, a memory part 202 including a Random Access Memory (RAM), a Read Only Memory (ROM) and the like, a disk drive 203 for the disk 110, and a Hard Disk Drive (HDD) 204 which are connected via a bus 200. In this embodiment, the display 102, the keyboard 103 and the mouse 104 are also connected to the CPU 201 via the bus 200. However, the display 102, the keyboard 103 and the mouse 104 may be connected directly to the CPU 201. In addition, the display 102 may be connected to the CPU 201 via a known graphic interface (not shown) which processes input and output image data.

In the computer system 100, the keyboard 103 and/or the mouse 104 forms an input part (or input means) of the circuit design support apparatus. The display 102 forms a display part (or display means) for displaying simulation results, such as analysis results, on the display screen 102a. The CPU 201 forms a first converting part (or first converting means) for converting the layout parameters of the circuit which is the analyzing target into the physical characteristics, a second converting part (or second converting means) for converting the physical characteristics into the SPICE parameters, and an analyzing part (or analyzing means) for analyzing the circuit based on the SPICE parameters. The memory part 202 and/or the disk drive 102 and/or the HDD 204 form a memory part (or memory means).

The structure of the computer system 100 is not limited to that shown in FIGS. 5 and 6, and various other known structures may be used instead.

Figure 7:
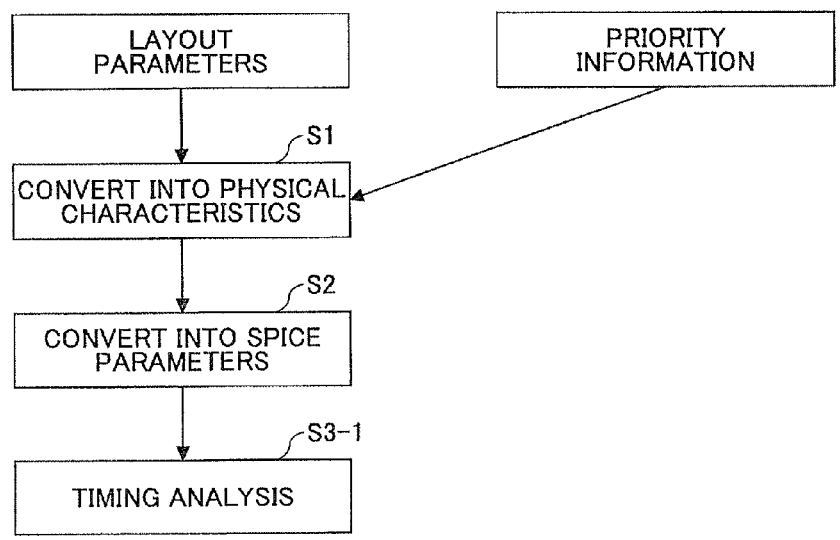
FIG. 7 is a flow chart for explaining an operation of a first embodiment of the present invention.

FIG. 7 is a flow chart for explaining an operation of a first embodiment of the present invention. The process shown in FIG. 7 is executed out by the CPU 201. In FIG. 7, those steps that are the same as those corresponding steps in FIG. 1 are designated by the same reference numerals, and a description thereof will be omitted. It is assumed for the sake of convenience that the priority information is set according to the type of the cells Cell1, Cell2 and Cell3, with the cell Cell1 having a highest priority "1", the cell Cell2 having a second highest priority "2", and the cell Cell3 having a third highest priority "3".

In FIG. 7, in a case where the circuit, which is the analyzing target, is formed by 200 cells, for example, a step S1 assumes with respect to the layout parameters read from the memory part or input from the input part that a predetermined number of cells greater than or equal to 100, that is, greater than or equal to one-half the number of cells forming the circuit, are the cells Cell having the highest priority "1". Based on this assumption, the step S1 converts the layout parameters after weighting the layout parameters depending on the priority of the cells. The table shown in FIG. 3. which is usable when the weighted layout parameters are converted into the physical characteristics in the step S1, is stored in the memory part, for example. A step S2 reads the physical characteristics from the memory part, converts the physical characteristics into the SPICE parameters, and stores the SPICE parameters in the memory part. Hence, with respect to 100 or more cells, for example, the layout parameters are fitted to the layout parameters of the cell Cell1 having the highest priority "1". Accordingly, based on the net list read from the memory part or input from the input part, a step S3-1 generates a net list including the SPICE parameters that take into consideration the layout parameters of the circuit read from the memory part, and can carry out a timing analysis based on the generated net list. Results of the timing analysis in the step S3-1 are stored in the memory part if necessary and are displayed on the display part. For this reason, it is possible to improve the accuracy of the circuit analysis, because the difference between the results of the circuit analysis (or simulation results) and the actually measured values that are obtained by actually creating the circuit and measuring the various characteristics of the circuit is suppressed, and it is possible to carry out the timing analysis by taking into consideration the deviation of the circuit characteristics that occurs as the size of the LSI circuit is further reduced.

In a modification of the first embodiment of the present invention, a step S1 shown in FIG. 7 converts the layout parameters into the physical characteristics after carrying out a weighting depending on the type of cell, namely, a weighting "x" with respect to the cell Cell1, a weighting "y" with respect to the cell Cell2 and a weighting "z" with respect to the cell Cell3, for example. For example, if x=100, y=60, z=40 and the circuit which is the analyzing target is formed by 200 cells, it is assumed that 100 cells are the cells Cell1, 60 cells are the cells Cell2 and 40 cells are the cells Cell3, and the layout parameters are fitted to the cells in a sequence starting from the cells having the highest priority "1" and then to the cells having the next highest priorities "2" and "3".

Figure 8:
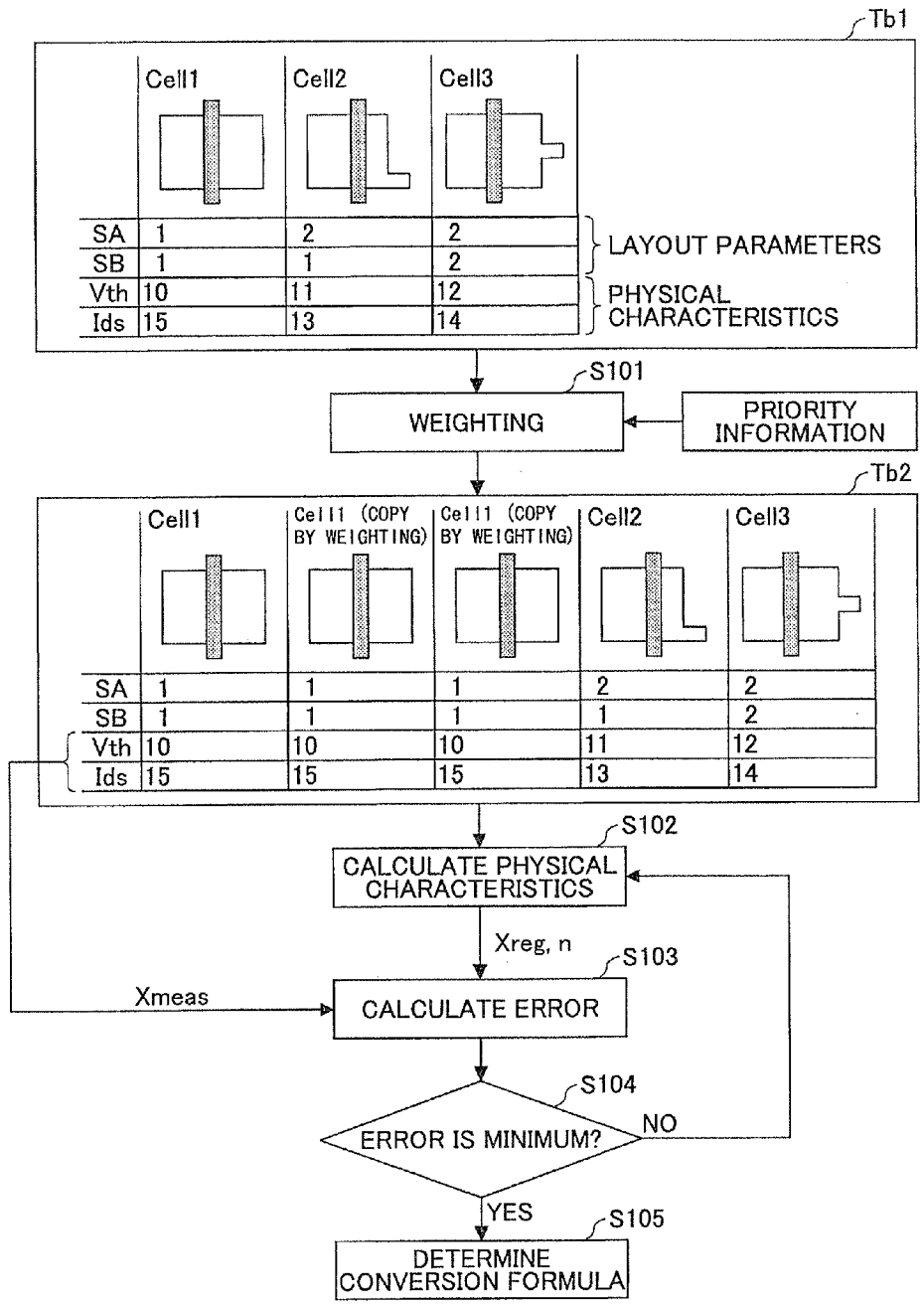
FIG. 8 is a flow chart for explaining an operation of a modification of the first embodiment.

FIG. 8 is a flow chart for explaining an operation of this modification of the first embodiment. FIG. 8 shows the process that is executed by the step S1 shown in FIG. 7. It is assumed for the sake of convenience that, in FIG. 8, a table Tb1 shows only a portion of the table shown in FIG. 3, and that this table Tb1 is converted into a table Tb2 by weighting. In the layout parameters used by the tables Tb1 and Tb2, the actually measured values and the simulation values are calibrated according to the Test Element Group (TEG), for example.

In a step S101 shown in FIG. 8, layout parameters SA and SB of the table Tb1 stored in the memory part are converted into layout parameters SA and SB of the table Tb after carrying out the weighting x=3 with respect to the cells Cell1, the weighting y=1 with respect to the cells Cell2 and the weighting z=1 with respect to the cells Cell3, for example, and the table Tb2 is stored in the memory part. In a step S102, the weighted layout parameters SA and SB of the table Tb2 are used to calculate the physical characteristics described by the function Fvth, that is, the threshold voltage Vth. For example, the threshold voltage Vth may be described by a function $Vth=a*SA+b*SB+c*SA*SB+d*SA^2+e*SB^2+f$, where a, b, c, d, e and f denote coefficients. Of course, the source-drain current Ids or, both the threshold voltage Vth and the source-drain current Ids may be calculated as the physical characteristics.

In a step S103, an error is calculated between a fitting result Xreg which is obtained using the weighted layout parameters of the table Tb2 and an actually measured value Xmeas of the physical characteristics of the table Tb2. For example, the error may be calculated from the following formula, where n denotes the number of data.

$$[\{\Sigma(Xreg-Xmeas)^2\}/n]^{1/2}$$

It is assumed for the sake of convenience that the error is calculated between the fitting result Xreg of the threshold voltage Vth and the actually measured value Xmeas.

In a step S104, a decision is made to determine whether the error is a minimum of the results calculated for the circuit which is the analyzing target or, the error has become less than or equal to a predetermined value. If the decision result in the step S104 is NO, the process returns to the step S102, the values of the coefficients a, b, c, d and e are adjusted and the steps S102 through S104 are repeated until the decision result in the step S104 becomes YES. On the other hand, if the decision result in the step S104 is YES, a step S105 determines (or commits or makes definite) the function, that is, the conversion formula, which is used to convert the weighted layout parameters into the physical characteristics. In this particular case, the function Fvth(SA', SB') is determined as the conversion formula which is used to convert the weighted layout parameters into the physical characteristics.

Therefore, the conversion formula is generated so that the error between the fitting result Xreg which is obtained using the weighted layout parameters and the actually measured value Xmeas of the physical characteristics becomes the minimum or becomes less than or equal to the predetermined value.

Figure 9:
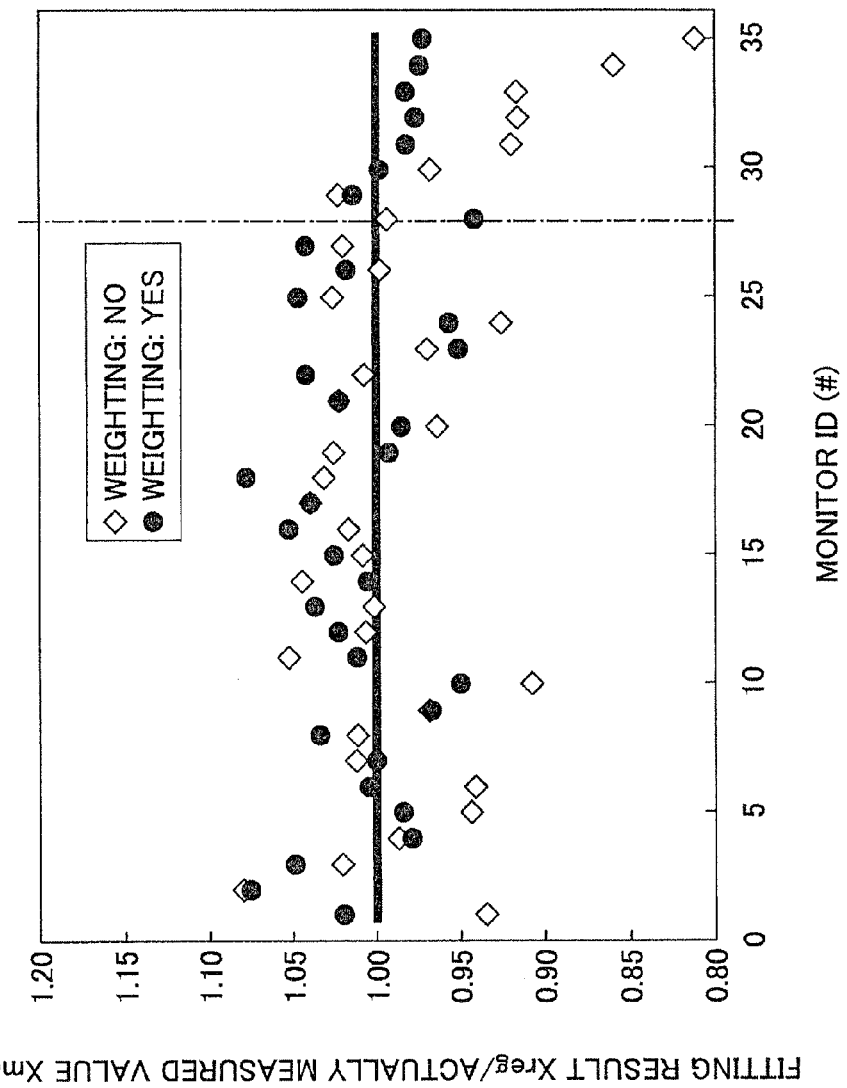
FIG. 9 is a diagram for explaining effects of the modification of the first embodiment.

FIG. 9 is a diagram for explaining effects of this modification of the first embodiment. In FIG. 9, the ordinate indicates a ratio Xreg/Xmeas between the fitting result Xreg and the actually measured value Xmeas of the physical characteristics, and the abscissa indicates a monitor identification (ID) which is assigned to each circuit that is analyzed. In FIG. 9, symbols ● show a case where the layout parameters are not weighted, and symbols ♦ show a case where the layout parameters are weighted. As may be seen from FIG. 9, the circuits having the monitor ID of #30 and after have the fitting result Xreg which is greatly deviated from the actually measured values. However, by carrying out a weighting x=100 with respect to the cells Cell based on the priority information for the circuits having the monitor IDs of #30 and after, it was confirmed that the fitting result Xreg that is obtained becomes closer to the actually measured value Xmeas.

As in the case of the first embodiment, it was confirmed that this modification of the first embodiment basically has similar tendencies as those shown in FIG. 9 even when the layout parameters are weighted depending on the priority of the cells.

Second Embodiment

Figure 10:
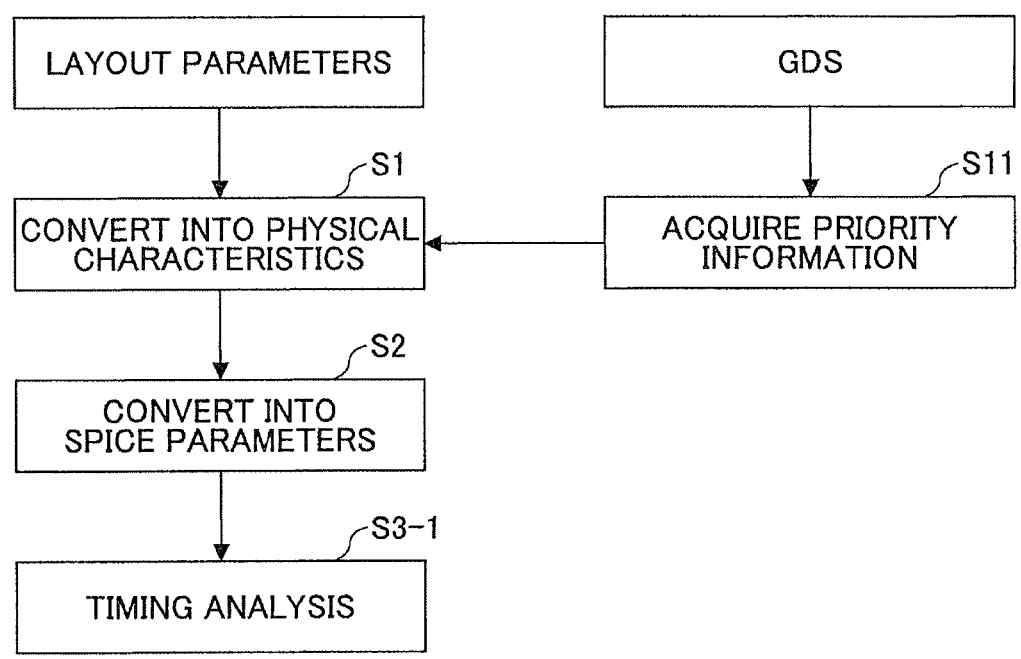
FIG. 10 is a flow chart for explaining an operation of a second embodiment of the present invention.

FIG. 10 is a flow chart for explaining an operation of a second embodiment of the present invention. In FIG. 10, those steps that are the same as those corresponding steps in FIG. 7 are designated by the same reference numerals, and a description thereof will be omitted.

In FIG. 10, a step S11 acquires from a GDS the types of cells and the number of each type of cell, as the priority information. The GDS may be input from the input part or, read from the memory part. A step S1 converts the layout parameters into the physical characteristics after carrying out a weighting in a sequence starting from the type of cell having the largest number in the circuit, based on the priority information. Otherwise, the process is similar to that of the first embodiment described above.

According to the second embodiment, it is possible to obtain effects similar to those obtainable in the first embodiment and the modification of the first embodiment described above.

Third Embodiment

Figure 11:
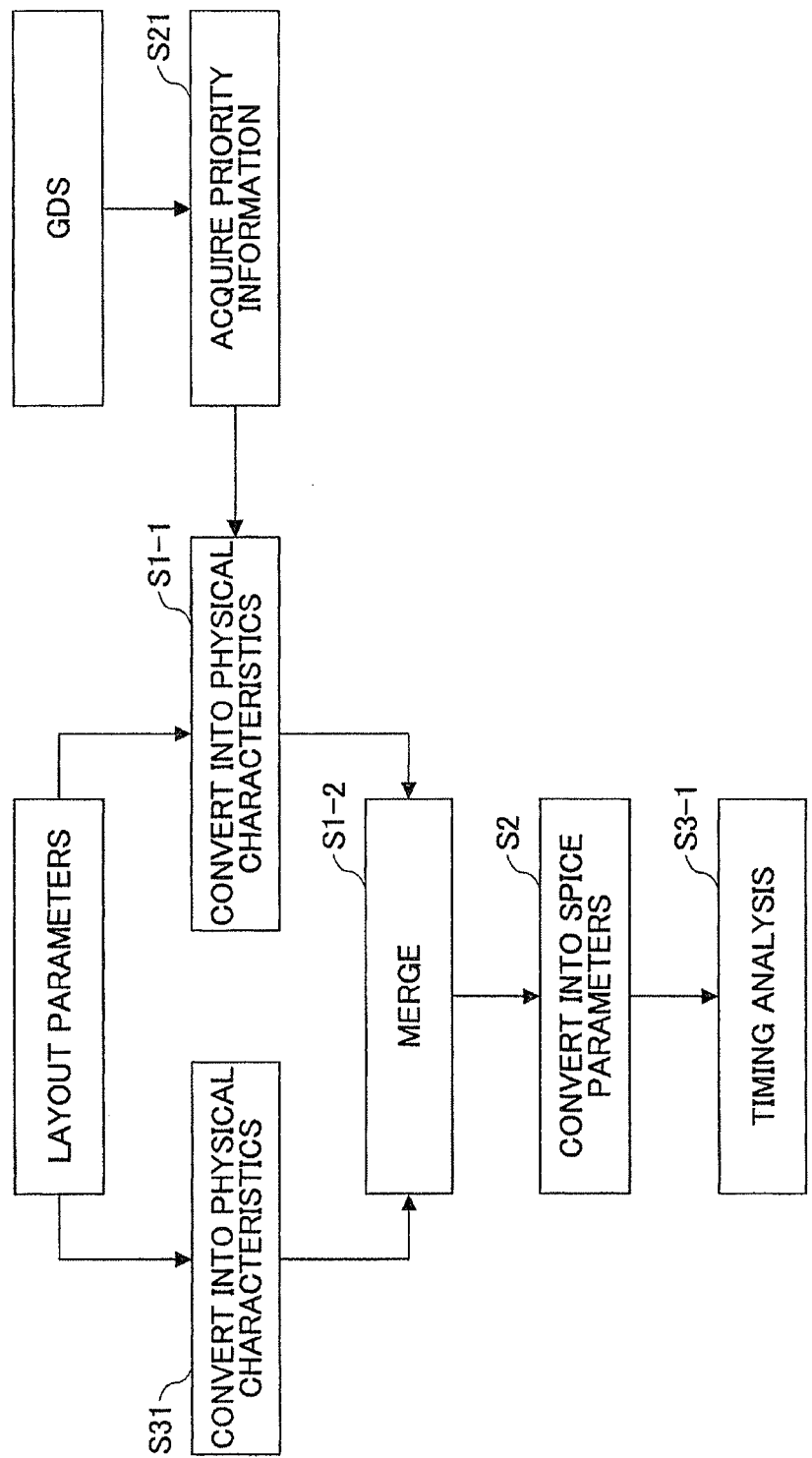
FIG. 11 is a flow chart for explaining an operation of a third embodiment of the present invention.

FIG. 11 is a flow chart for explaining an operation of a third embodiment of the present invention. In FIG. 11, those steps that are the same as those corresponding steps in FIG. 7 are designated by the same reference numerals, and a description thereof will be omitted.

In FIG. 11, a step S21 acquires from a GDS the types of cells and the number of each type of cell, as the priority information. The GDS may be input from the input part or, read from the memory part. A step S1-1 converts the layout parameters into the physical characteristics after carrying out a weighting only with respect to a specific type of cell in the circuit or, only with respect to a type of cell which amounts to a predetermined number or more in the circuit, based on the priority information. A step S31 converts the layout parameters into the physical characteristics for all of the cells in the circuit. A step S1-2 obtains physical characteristics by merging the physical characteristics obtained in the step S1-1 and the physical characteristic obtained in the step S31. Because the physical characteristics obtained in the step S1-2 place importance on the specific type of cell in the circuit or, the type of cell which amounts to the predetermined number or more in the circuit, the merged physical characteristics are suited for use in analyzing a particular cell using the SPICE parameters and the like. Otherwise, the process is similar to that of the first embodiment described above.

According to the third embodiment, it is possible to obtain effects similar to those obtainable in the first embodiment and the modification of the first embodiment described above.

In each of the embodiments described above, the net list including the SPICE parameters is used for the timing analysis. However, the net list, which is obtained by weighting the layout parameters of the cells forming the circuit based on the priority information such as the types of cells and the number of cells when converting the layout parameters into the physical characteristics, and includes the SPICE parameters obtained by converting the physical characteristics that are obtained by such a conversion, is of course usable for analysis (or simulation) of currents, voltages and the like other than the timing analysis. In addition, the SPICE parameters, which are obtained by converting the physical characteristics that are obtained by such a conversion, are also usable for various kinds of analysis of SPICE models.

This application claims the benefit of a Japanese Patent Application No. 2007-198003 filed Jul. 30, 2007, in the Japanese Patent Office, the disclosure of which is hereby incorporated by reference.

Further, the present invention is not limited to these embodiments, but various variations and modifications may be made without departing from the scope of the present invention.

What is claimed is:

1. A simulation method to be implemented in a computer, the simulation method comprising:
   a first converting procedure carrying out, by the computer, a weighting with respect to layout parameters of a circuit, which is an analyzing target, based on priority information of cells forming the circuit, and converting, by the computer, the weighted layout parameters into physical characteristics and storing the physical characteristics in a memory part;
   a second converting procedure converting, by the computer, the physical characteristic read from the memory part into circuit parameters and storing, by the computer, the circuit parameters into the memory part; and
   an analyzing procedure analyzing, by the computer, the circuit based on a net list that includes the circuit parameters read from the memory part,
   wherein the priority information is a type of the cells or a number of the cells included in the circuit, and
   wherein the layout parameters include shape information of the cells, the physical characteristics include a threshold voltage of transistors included in the cells or a current flowing through the transistors included in the cells, and the circuit parameters include information for changing the physical characteristics.

2. The simulation method as claimed in claim 1, wherein:
   said first converting procedure converts, by the computer, layout parameters which have not been subjected to the weighting into physical characteristics which are merged to the physical characteristics that are converted from the weighted layout parameters; and
   said second converting procedure converts, by the computer, the merged physical characteristics into the circuit parameters.

3. The simulation method as claimed in claim 1, wherein said analyzing procedure carries out, by the computer, a timing analysis at a layout design stage of the circuit.

4. The simulation method as claimed in claim 1, wherein said analyzing procedure displays, by the computer, a result of the analysis on a display part.

5. The simulation method as claimed in claim 1, wherein said first converting procedure generates, by the computer, a conversion formula that is used for the conversion so that an error between a fitting result which is obtained by using the weighted layout parameters and actually measured values of the physical characteristics becomes less than or equal to a predetermined value.

6. A simulation method to be implemented in a computer, the simulation method comprising:
   a first converting procedure carrying out, by the computer, a weighting with respect to layout parameters of a circuit, which is an analyzing target, based on priority information of cells forming the circuit, and converting, by the computer, the weighted layout parameters into physical characteristics and storing the physical characteristics in a memory part; and
   a second converting procedure converting, by the computer, the physical characteristic read from the memory part into circuit parameters and storing, by the computer, the circuit parameters into the memory part,
   wherein circuit characteristics which differ depending on the layout parameters are reflected to the circuit parameters,
   the priority information is a type of the cells or a number of the cells included in the circuit, and
   the layout parameters include shape information of the cells, the physical characteristics include a threshold voltage of transistors included in the cells or a current flowing through the transistors included in the cells, and the circuit parameters include information for changing the physical characteristics.

7. A non-transitory computer-readable storage medium which stores a program which, when executed by a computer, causes the computer to perform a circuit simulation process, said circuit simulation process comprising:
   a first converting procedure causing the computer to carry out a weighting with respect to layout parameters of a circuit, which is an analyzing target, based on priority information of cells forming the circuit, and to convert the weighted layout parameters into physical characteristics and store the physical characteristics in a memory part;
   a second converting procedure causing the computer to convert the physical characteristic read from the memory part into circuit parameters and store the circuit parameters into the memory part; and
   an analyzing procedure causing the computer to analyze the circuit based on a net list that includes the circuit parameters read from the memory part,
   wherein the priority information is a type of the cells or a number of the cells included in the circuit, and
   wherein the layout parameters include shape information of the cells, the physical characteristics include a threshold voltage of transistors included in the cells or a current flowing through the transistors included in the cells, and the circuit parameters include information for changing the physical characteristics.

8. The non-transitory computer-readable storage medium as claimed in claim 7, wherein:
   said first converting procedure causes the computer to convert layout parameters which have not been subjected to the weighting into physical characteristics which are merged to the physical characteristics that are converted from the weighted layout parameters; and
   said second converting procedure causes the computer to convert the merged physical characteristics into the circuit parameters.

9. The non-transitory computer-readable storage medium as claimed in claim 7, wherein said analyzing procedure causes the computer to carry out a timing analysis at a layout design stage of the circuit.

10. The non-transitory computer-readable storage medium as claimed in claim 7, wherein said analyzing procedure causes the computer to display a result of the analysis on a display part.

11. The non-transitory computer-readable storage medium as claimed in claim 7, wherein said first converting procedure causes the computer to generate a conversion formula that is used for the conversion so that an error between a fitting result which is obtained by using the weighted layout parameters and actually measured values of the physical characteristics becomes less than or equal to a predetermined value.

\* \* \* \* \*